(12) United States Patent
Hong et al.

(10) Patent No.: US 12,406,918 B2
(45) Date of Patent: Sep. 2, 2025

(54) PRINTED CIRCUIT BOARD AND ELECTRONIC COMPONENT PACKAGE

(71) Applicant: SAMSUNG ELECTRO-MECHANICS CO., LTD., Suwon-si (KR)

(72) Inventors: Suk Chang Hong, Suwon-si (KR); Yong Duk Lee, Suwon-si (KR); Sang Hoon Kim, Suwon-si (KR); Ki Gon Kim, Suwon-si (KR); Woo Jeong Choi, Suwon-si (KR); Cheol Min Shin, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 460 days.

(21) Appl. No.: 17/743,775

(22) Filed: May 13, 2022

(65) Prior Publication Data

US 2023/0215794 A1    Jul. 6, 2023

(30) Foreign Application Priority Data

Jan. 3, 2022    (KR) .................. 10-2022-0000391

(51) Int. Cl.
*H01L 23/498* (2006.01)
*H01L 21/48* (2006.01)
(Continued)

(52) U.S. Cl.
CPC .... *H01L 23/49838* (2013.01); *H01L 21/4857* (2013.01); *H01L 23/49822* (2013.01);
(Continued)

(58) Field of Classification Search
CPC ............... H01L 23/49822; H01L 24/81; H01L 24/13; H01L 24/16; H01L 21/4857; H01L 23/00;
(Continued)

(56) References Cited

U.S. PATENT DOCUMENTS

| | | | |
|---|---|---|---|
| 9,775,230 B2* | 9/2017 | Kim | H05K 1/0219 |
| 9,972,589 B1* | 5/2018 | Goh | H01L 23/528 |
| 10,256,175 B2* | 4/2019 | Ishihara | H01L 21/4853 |
| 10,595,413 B2* | 3/2020 | Kim | H05K 1/0203 |

(Continued)

FOREIGN PATENT DOCUMENTS

| | | |
|---|---|---|
| KR | 10-2016-0046657 A | 4/2016 |
| KR | 10-2016-0058666 A | 5/2016 |

*Primary Examiner* — Mohsen Ahmadi
(74) *Attorney, Agent, or Firm* — MORGAN, LEWIS & BOCKIUS LLP

(57) ABSTRACT

A printed circuit board includes: a substrate layer in which a plurality of insulating layers and a plurality of wiring patterns are repeatedly layered, the substrate layer including a conductive via layer disposed in one of the plurality of insulating layers to connect wiring patterns, among the plurality of wiring patterns, disposed on upper and lower surfaces of the one insulating layer, respectively; an uppermost substrate layer including an outermost insulating layer disposed outermost within the substrate layer, and a first upper wiring pattern disposed in the outermost insulating layer; and a bump pad disposed on a portion of an upper surface of the first upper wiring pattern and having a length shorter than a length of the first upper wiring pattern.

18 Claims, 8 Drawing Sheets

(51) Int. Cl.
  *H01L 23/00* (2006.01)
  *H01L 23/12* (2006.01)
  *H05K 1/11* (2006.01)
  *H05K 1/18* (2006.01)
  *H05K 3/34* (2006.01)

(52) U.S. Cl.
  CPC .... *H01L 24/16* (2013.01); *H01L 2224/16227* (2013.01); *H01L 2224/16238* (2013.01); *H05K 2201/09845* (2013.01)

(58) Field of Classification Search
  CPC .............. H01L 23/49816; H01L 21/48; H05K 2201/09845
  See application file for complete search history.

(56) References Cited

U.S. PATENT DOCUMENTS

| | | | |
|---|---|---|---|
| 2008/0251917 A1* | 10/2008 | Chu | H05K 3/243 257/738 |
| 2016/0143137 A1 | 5/2016 | Baek et al. | |
| 2020/0118990 A1* | 4/2020 | Xu | H01L 23/5383 |
| 2021/0202402 A1* | 7/2021 | Kim | H01L 23/49822 |
| 2022/0052005 A1* | 2/2022 | Kim | H01L 24/14 |
| 2022/0059640 A1* | 2/2022 | Park | H10K 59/131 |
| 2022/0139799 A1* | 5/2022 | Jung | H01L 23/36 361/749 |
| 2022/0337211 A1* | 10/2022 | Cardona | H03H 3/02 |
| 2022/0406873 A1* | 12/2022 | Kim | H10K 77/10 |
| 2023/0062146 A1* | 3/2023 | Wu | H01L 24/32 |
| 2023/0111555 A1* | 4/2023 | Kim | H01L 25/0657 257/528 |

\* cited by examiner

'C'

PRINTED CIRCUIT BOARD AND ELECTRONIC COMPONENT PACKAGE

CROSS-REFERENCE TO RELATED APPLICATION(S)

This application claims benefit of priority to Korean Patent Application No. 10-2022-0000391 filed on Jan. 3, 2022 in the Korean Intellectual Property Office, the disclosure of which is incorporated herein by reference in its entirety.

TECHNICAL FIELD

The present disclosure relates to a printed circuit board and an electronic component package including the same.

BACKGROUND

Miniaturization and improvements in performance of small-sized terminal electronic products such as mobile devices are rapidly progressing. Therefore, for a thin and high-performance access point (AP) chip and a non-memory semiconductor chip such as a central processing unit (CPU), a pitch of nodes has been continuously reduced and high integration development has been pursued.

When manufacturing a printed circuit board including bump pads which are densely arranged with a small pitch therebetween and on which a semiconductor chip is mounted, in a case in which a pitch of the bump pads is reduced, a serious short circuit caused by a solder bridge occurs when the chip is mounted, which may be problematic. Further, when soldering is performed, cracking may occur in the bump pad.

In addition, in a case in which solder wicking to the node of the semiconductor chip occurs due to the reduction in the pitch of the bump pads, more serious defects may be caused.

SUMMARY

An aspect of the present disclosure may provide a printed circuit board solving a problem caused when a chip is mounted, even with bump pads densely arranged with a small pitch therebetween.

Another aspect of the present disclosure may provide an electronic component package in which a semiconductor chip having a reduced pitch of nodes is stably mounted on a printed circuit board in which bump pads are densely arranged with a small pitch therebetween.

According to an aspect of the present disclosure, a printed circuit board may include: a substrate layer in which a plurality of insulating layers and a plurality of wiring patterns are repeatedly layered, the substrate layer including a conductive via layer disposed in one of the plurality of insulating layers to connect wiring patterns, among the plurality of wiring patterns, disposed on upper and lower surfaces of the one insulating layer, respectively; an uppermost substrate layer including an outermost insulating layer disposed outermost within the substrate layer, and a first upper wiring pattern disposed in the outermost insulating layer; and a bump pad disposed on a portion of an upper surface of the first upper wiring pattern and having a length shorter than a length of the first upper wiring pattern.

According to another aspect of the present disclosure, a printed circuit board may include: a substrate layer in which a plurality of insulating layers and a plurality of wiring patterns are repeatedly layered, the substrate layer including a conductive via layer disposed in one of the plurality of insulating layers to connect wiring patterns, among the plurality of wiring patterns, disposed on upper and lower surfaces of the one insulating layer, respectively; an uppermost substrate layer including an outermost insulating layer disposed outermost within the substrate layer, and a first upper wiring pattern disposed in the outermost insulating layer; a bump pad disposed on a portion of an upper surface of the first upper wiring pattern; and a solder resist layer having a hole exposing the bump pad. Another portion of the upper surface of the first upper wiring pattern may be lower than an upper surface of the outermost insulating layer, the outermost insulating layer may have a solder dam protruding so as to be higher than the one portion of the upper surface of the first upper wiring pattern, and a recess portion is provided between a side surface of the solder dam and a side surface of the bump pad.

According to another aspect of the present disclosure, an electronic component package may include: a printed circuit board including a substrate layer in which a plurality of insulating layers and a plurality of wiring patterns are repeatedly layered, the substrate layer including a conductive via layer disposed in one of the plurality of insulating layers to connect wiring patterns, among the plurality of wiring patterns, disposed on upper and lower surfaces of the one insulating layer, respectively, an uppermost substrate layer including an outermost insulating layer disposed outermost within the substrate layer, and a first upper wiring pattern disposed in the outermost insulating layer, and a bump pad disposed on a portion of an upper surface of the first upper wiring pattern and having a length shorter than a length of the first upper wiring pattern; and a solder resist layer having a hole exposing the bump pad; and a semiconductor chip connected to the bump pad by a solder.

According to another aspect of the present disclosure, a printed circuit board may include: a substrate layer in which a plurality of insulating layers and a plurality of wiring patterns are repeatedly layered, the substrate layer including a conductive via layer disposed in one of the plurality of insulating layers to connect wiring patterns, among the plurality of wiring patterns, disposed on upper and lower surfaces of the one insulating layer, respectively; an uppermost substrate layer including an outermost insulating layer disposed outermost within the substrate layer, and a first upper wiring pattern disposed in the outermost insulating layer; and a bump pad disposed on the first upper wiring pattern. The outermost insulating layer may include a dam protruding with respect to a recess portion disposed between the outermost insulating layer and the bump pad.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will now be described in detail with reference to the accompanying drawings.

Electronic Device System

Figure 1:
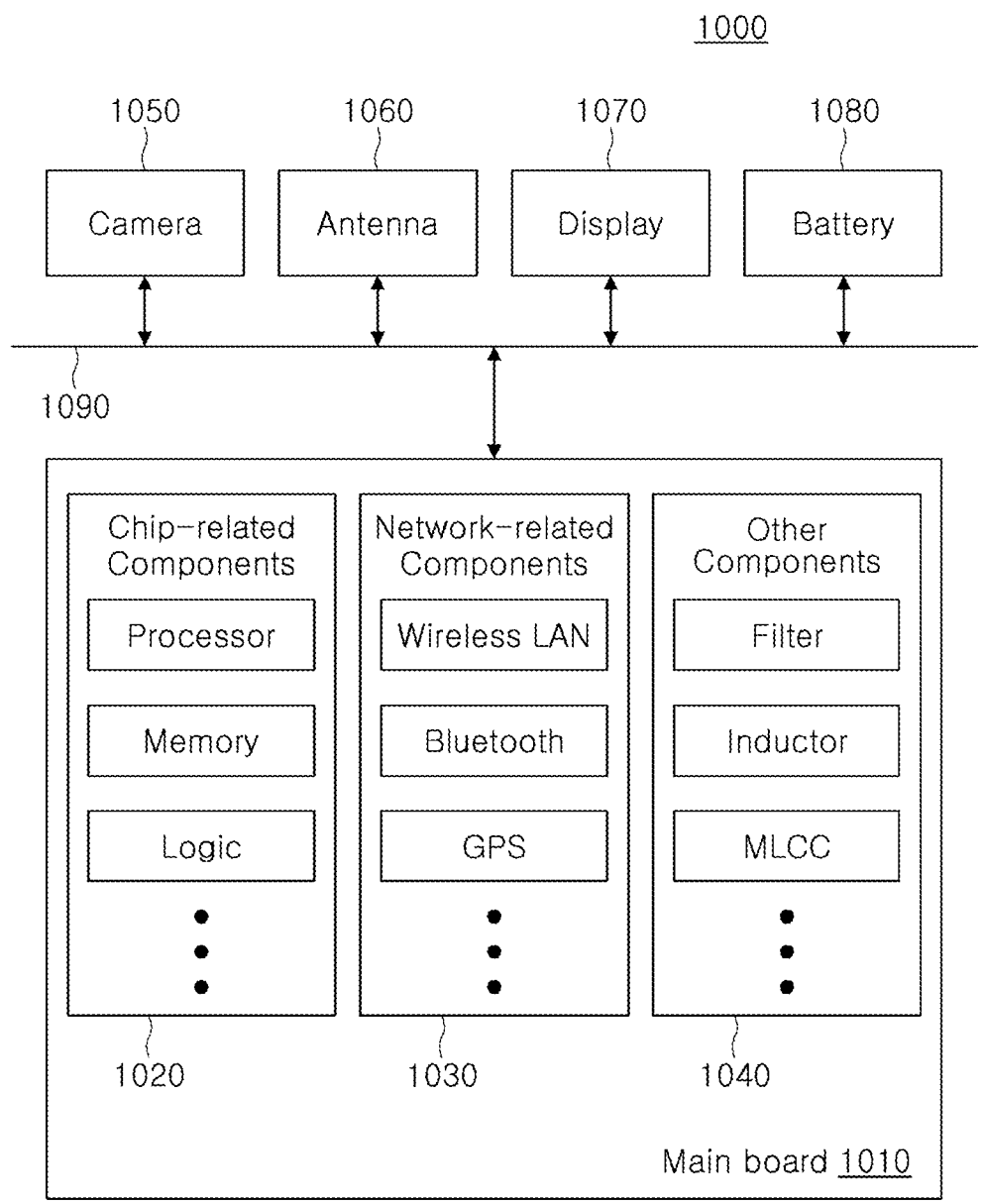
FIG. 1 is a block diagram schematically illustrating an example of an electronic device system.

FIG. 1 is a block diagram schematically illustrating an example of an electronic device system.

Referring to FIG. 1, an electronic device 1000 may accommodate a main board 1010 therein. The main board 1010 may include chip-related components 1020, network-related components 1030, other components 1040, and the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), or a flash memory; an application processor chip such as a central processor (for example, a central processing unit (CPU)), a graphics processor (for example, a graphics processing unit (GPU)), a digital signal processor, a cryptographic processor, a microprocessor, or a microcontroller; and a logic chip such as an analog-to-digital (ADC) converter or an application-specific integrated circuit (ASIC). However, the chip-related components 1020 are not limited thereto, but may also include other types of chip-related components. Further, these chip-related components may be combined with each other. The chip-related components 1020 may be in a form of a package including the above-described chips.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network-related components 1030 are not limited thereto, but may also include a variety of other wireless or wired standards or protocols. In addition, the network-related components 1030 may be combined with the chip-related components 1020 and provided in a form of a package.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive elements in a form of a chip component used for various other purposes, or the like. In addition, other components 1040 may be combined with the chip-related components 1020 and/or network-related components 1030 and provided in a form of a package.

Depending on a type of the electronic device 1000, the electronic device 1000 may include other components that may or may not be physically or electrically connected to the main board 1010. Examples of other components include a camera module 1050, an antenna module 1060, a display 1070, and a battery 1080. However, other components are not limited thereto, but may include an audio codec, a video codec, a power amplifier, a compass, an accelerometer, a gyroscope, a speaker, a mass storage device (for example, a hard disk drive), a compact disk (CD), a digital versatile disk (DVD), and the like. In addition, the electronic device 1000 may include other components used for various purposes depending on the type of the electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
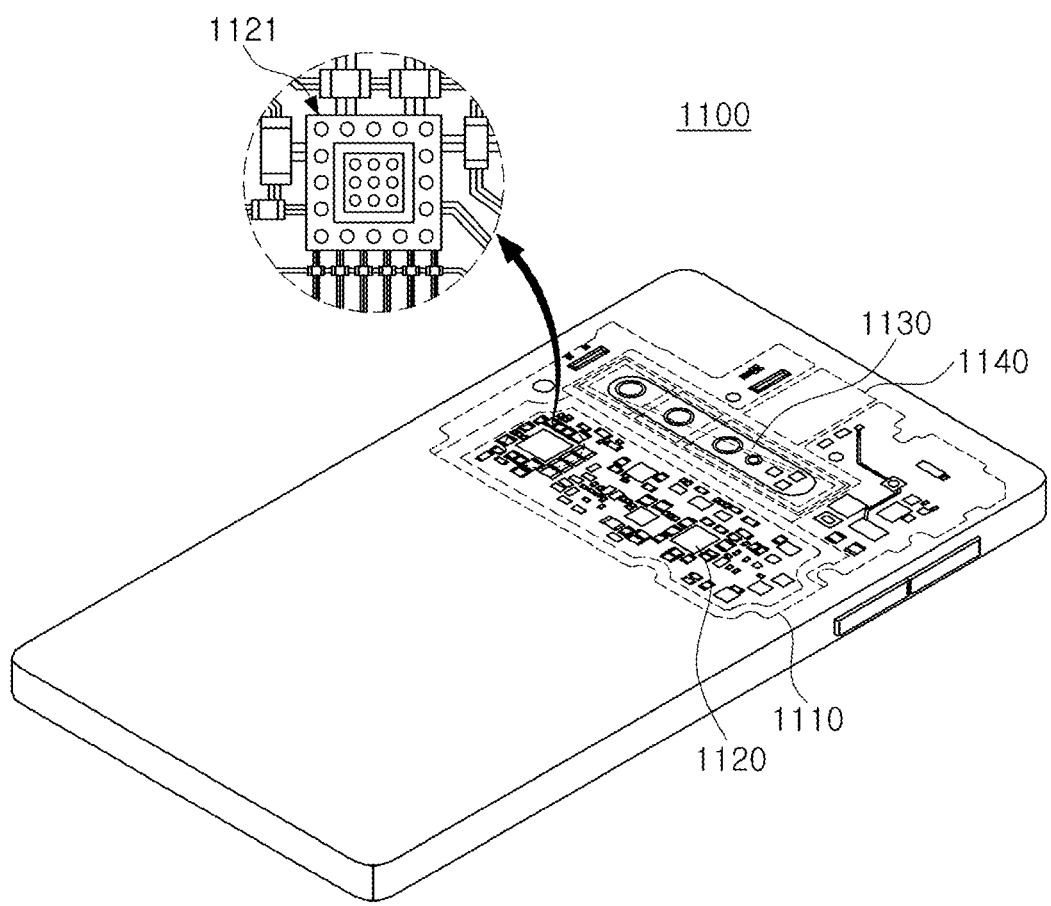
FIG. 2 is a perspective view schematically illustrating an example of an electronic device.

FIG. 2 is a perspective view schematically illustrating an example of the electronic device.

Referring to FIG. 2, the electronic device may be, for example, a smartphone 1100. A motherboard 1110 may be accommodated in the smartphone 1100, and various electronic components 1120 are physically and/or electrically connected to the motherboard 1110. Further, a camera module 1130, a speaker 1140, and/or the like are accommodated in the smartphone 1000. Some of the electronic components 1120 may be the above-described chip-related components such as a bridge-embedded board 1121 having a surface on which a plurality of electronic components are mounted, but the electronic components 1120 are not limited thereto. Meanwhile, the electronic device is not necessarily limited to the smartphone 1100, but may be other electronic devices as described above.

Printed Circuit Board

Figure 3:
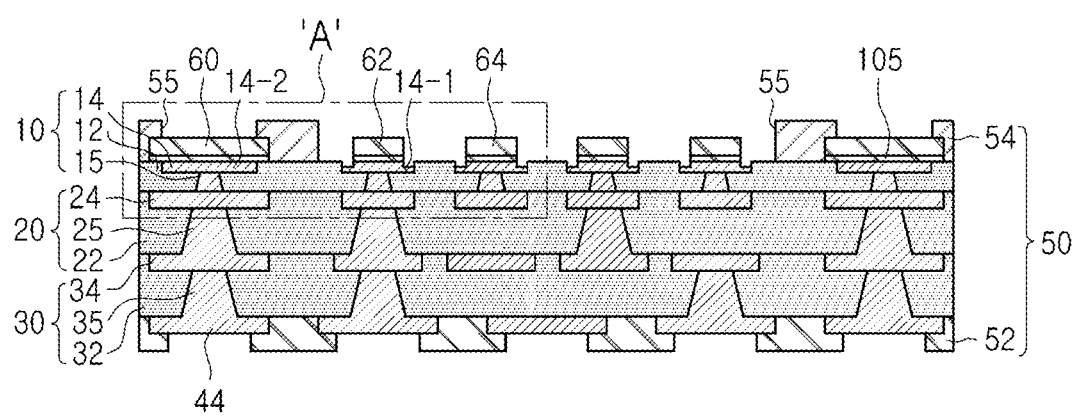
FIG. 3 is a cross-sectional view schematically illustrating a cross section of a printed circuit board according to an exemplary embodiment in the present disclosure.
Figure 4:
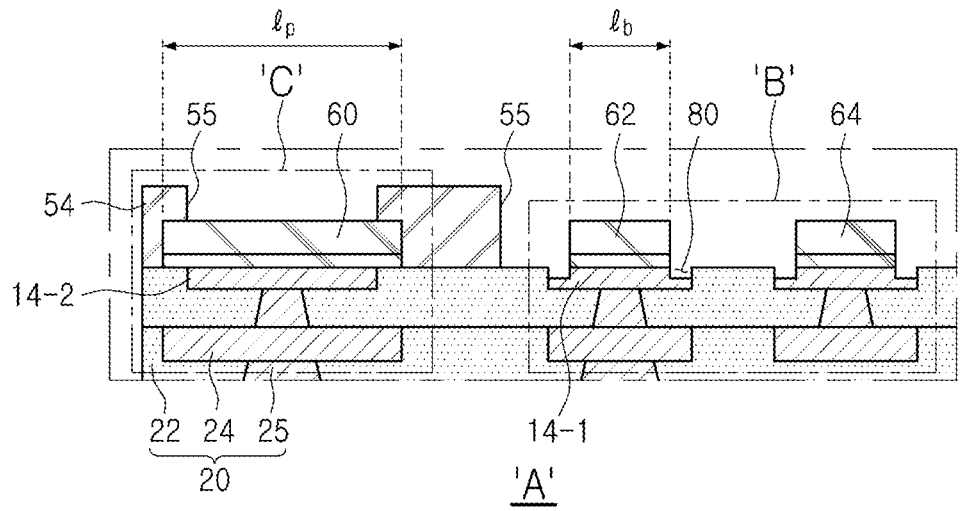
FIG. 4 is an enlarged view of Part A of FIG. 3.
Figure 5:
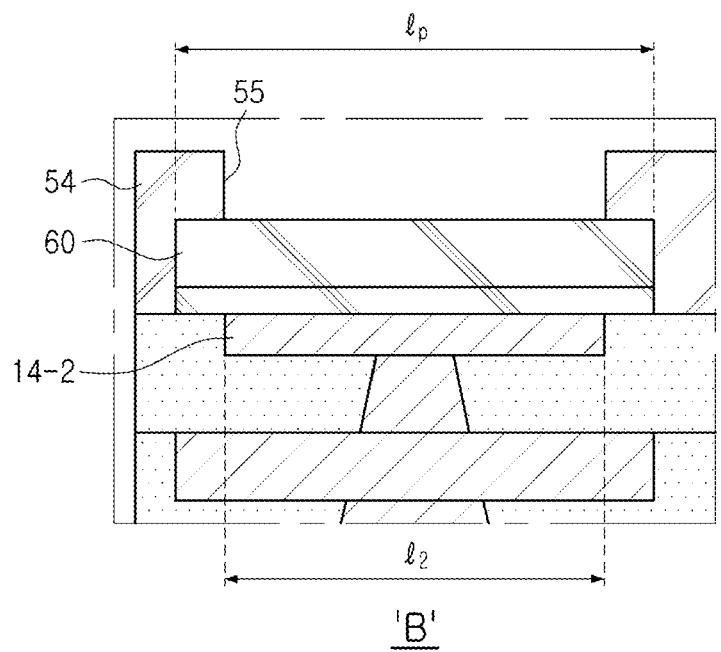
FIG. 5 is an enlarged view of Part B of FIG. 4.
Figure 6:
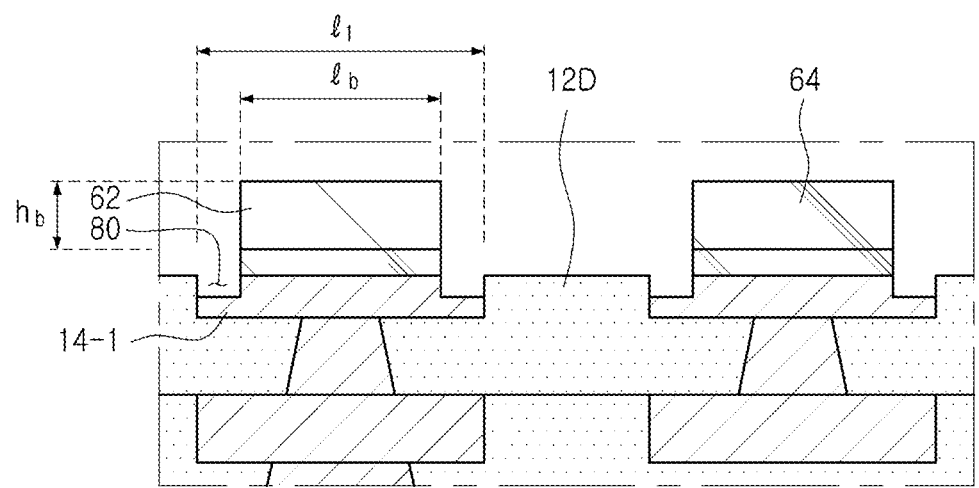
FIG. 6 is an enlarged view of Part C of FIG. 4.

FIG. 3 is a cross-sectional view schematically illustrating a cross section of a printed circuit board according to an exemplary embodiment in the present disclosure, FIG. 4 is an enlarged view of Part A of FIG. 3, FIG. 5 is an enlarged view of Part B of FIG. 4, and FIG. 6 is an enlarged view of Part C of FIG. 4.

Referring to FIGS. 3 through 6, a printed circuit board 1 according to an exemplary embodiment in the present disclosure may include substrate layers 10, 20, and 30, conductor via layers 15, 25, and 35, an uppermost substrate layer 10, an external connection pad 60, and a bump pad 62.

Each of the substrate layers 10, 20, and 30 may include a plurality of insulating layers 12, 22, and 32 and a plurality of wiring patterns 14, 24, and 34. In the printed circuit board 1, the plurality of insulating layers 12, 22, and 32 and the plurality of wiring patterns 14, 24, and 34 may be repeatedly layered.

In a case in which the substrate layers in the printed circuit board 1 are referred to as a first substrate layer 10, a second substrate layer 20, and a third substrate layer 30, respectively, from the top in the drawing, a first wiring pattern 14 in an upper surface of a first insulating layer 12 in the first substrate layer 10, and a second wiring pattern 24 on a lower surface of the first insulating layer 12 may be connected to each other by a first conductive via layer 15 penetrating through the first insulating layer 12.

In this way, the second wiring pattern 24 and a third wiring pattern 34 may be connected to a second conductor via layer 25, and the third wiring pattern 34 and a lowermost external connection pad 44 may be connected to the third conductive via layer 35.

According to the exemplary embodiment illustrated in FIG. 3, in the printed circuit board 1, each of the number of insulating layers 12, 22, and 32 and the number of wiring patterns 14, 24, and 34 is three, but the printed circuit board 1 may include more built-up insulating layers and wiring patterns as necessary.

The insulating layers 12, 22, and 32 may be formed of a glass-containing insulating material or a glass-free inorganic insulating resin. Prepreg (PPG) may be used as the glass-containing insulating material, and an Ajinomoto build-up film (ABF) may be used as the glass-free inorganic insulating resin. However, the insulating material is not particularly limited.

In addition, the insulating layers 12, 22, and 32 may be organic insulating layer including at least one of the ABF and polyimide, but are not limited thereto.

Among the wiring patterns 14, 24, and 34, a wiring pattern formed in the outermost layer of the printed circuit board 1 and exposed to the outside may be referred to as a connection pad. The connection pad may be connected to an external semiconductor chip or another board.

The wiring patterns 14, 24, and 34 may be conductive metal layers formed by electroplating, chemical plating, or sputtering, and materials of the wiring patterns 14, 24, and 34 may be copper (Cu), aluminum (Al), silver (Ag), tin (Sn), gold (Au), nickel (Ni), lead (Pb), titanium (Ti), or alloys thereof.

A metal material may be used as a material of the plurality of conductive via layers 15, 25, and 35, and examples of the metal material may include copper (Cu), aluminum (Al), silver (Ag), tin (Sn), gold (Au), nickel (Ni), lead (Pb), titanium (Ti), and an alloy thereof. The plurality of conductor via layers 15, 25, and 35 may include a signal connection via, a ground connection via, a power connection via, and the like according to the design. Each of wiring vias of the plurality of conductor via layers 15, 25, and 35 may be completely filled with a metal material, or the metal material may be formed along a wall surface of a via hole. The plurality of conductive via layers 15, 25, and 35 may have a tapered shape, and may be formed by plating, for example, an additive process (AP), a semi additive process (SAP), a modified semi additive process (MSAP), tenting (TT), or the like. As a result, each of the plurality of conductive via layers 15, 25, and 35 may include a seed layer, which is an electroless plating layer, and an electrolytic plating layer formed based on the seed layer. The number of conductor via layers 15, 25, and 35 may be more or less than illustrated in the drawings.

Here, in a case in which the first substrate layer 10 formed at the uppermost portion of the substrate layers 10, 20, and 30 is referred to as the uppermost substrate layer, a first upper wiring pattern 14-1 and a second upper wiring pattern 14-2 may be disposed in the outermost insulating layer 12. The first upper wiring pattern 14-1 may be disposed to be spaced apart from the second upper wiring pattern 14-2, the external connection pad 60 may be disposed on an upper surface of the second wiring pattern 14-2, and the bump pad 62 may be disposed on an upper surface of the first upper wiring pattern 14-1. A length $l_p$ of the external connection pad 60 may be larger than a length $l_b$ of the bump pad 62.

The bump pad 62 may be an external connection pad for mounting a semiconductor chip in which nodes are formed with a small pitch therebetween, and the external connection pad 60 may be a wiring pattern to which another external printed circuit board, a passive component, or the like is connected by soldering.

A pitch between the bump pads 62 may be small, and the bump pads 62 may be densely connected to the nodes of the semiconductor chip.

Solder resist layers 52 and 54 may be formed on the outermost layer of the printed circuit board 1 to prevent reflow of a solder at the time of connection to an external electronic component. The solder resist layers 52 and 54 may have holes 55 exposing the external connection pad 60 and the bump pad 62. In one example, the solder resist layer 54 may be spaced apart from the bump pad 62.

The solder resist layers 52 and 54 may be formed of a photosensitive material or a thermosetting material, and may be formed by a screen printing method. In this case, a solder resist 50 may be formed by, for example, laminating or coating a film-shaped resist material.

Referring to FIGS. 4 and 5, a length $l_2$ of the second upper wiring pattern 14-2 may be smaller than the length $l_p$ of the external connection pad 60. Since the length $l_p$ of the external connection pad 60 is larger than that of the second upper wiring pattern 14-2, mounting strength may increase in surface mounting. In addition, a height of a solder ball may be higher in a case in which another wiring layer, that is, the external connection pad 60, is provided, than in a case in which the second upper wiring pattern 14-2 serves as the external connection pad, and since a thickness of a central portion of the external connection pad 60 is increased, solder ball crack defects caused by metal consumption of the connection pad may be suppressed.

FIGS. 4 and 6 illustrate the bump pads 62 arranged with a small pitch therebetween.

The length $l_b$ of the bump pad 62 is smaller than a length $l_1$ of the first upper wiring pattern 14-1. An upper surface of the bump pad 62 is higher than an upper surface of the outermost insulating layer 12. In addition, the upper surface of the first upper wiring pattern 14-1 that is not covered by the bump pad 62 is lower than the upper surface of the outermost insulating layer 12, and the outermost insulating layer 12 has a solder dam 12D protruding so as to be higher than the upper surface of the first upper wiring pattern 14-1.

A space 80 (e.g., a recess portion or a groove portion) may be formed between a side surface of the solder dam 12D and a side surface of the bump pad 62 to accommodate a solder during soldering, thereby effectively preventing a short circuit caused by a solder bridge from occurring between the bump pads 62. A length of the space 80 between the side surface of the solder dam 12D and the side surface of the bump pad 62 may be 5 μm or more, which is effective in preventing the short circuit caused by a solder bridge.

Since the solder dam 12D is formed when a seed metal foil of a carrier is removed during a process of manufacturing of the printed circuit board, the solder dam 12D has a naturally determined depth, and it is preferable that a depth of a step of the solder dam 12D is 1 to 6 μm.

In general, in a case in which the pitch between the bump pads 62 is 90 μm or less, a risk of soldering failure is high when soldering, but the bump pad 62 having a structure according to the present disclosure is effective in preventing a short circuit caused by solder bleeding.

In a case in which a height from the upper surface of the insulating layer 12 to the upper surface of the bump pad 62 higher than the upper surface of the insulating layer 12 is defined as a bump pad protrusion height $h_b$, when the bump pad protrusion height $h_b$ is 7 μm or more, the solder ball crack defects due to metal consumption of the bump pad 62 may be suppressed, and a height of the package may be effectively reduced. When the bump pad protrusion height $h_b$ is less than 7 μm, the solder ball crack defects due to metal consumption of the bump pad 62 may not be effectively suppressed.

Meanwhile, since there is no other wiring pattern passing between the bump pad 62 and another bump pad 64, a short circuit caused by a solder bridge may be prevented from occurring between the bump pad 62 and another bump pad 64 arranged with a small pitch therebetween. FIGS. 7a through 7d are cross-sectional views illustrating a process S1 of manufacturing the printed circuit board before separation from the carrier in a method for manufacturing the printed circuit board of FIG. 3.

Figure 7A:
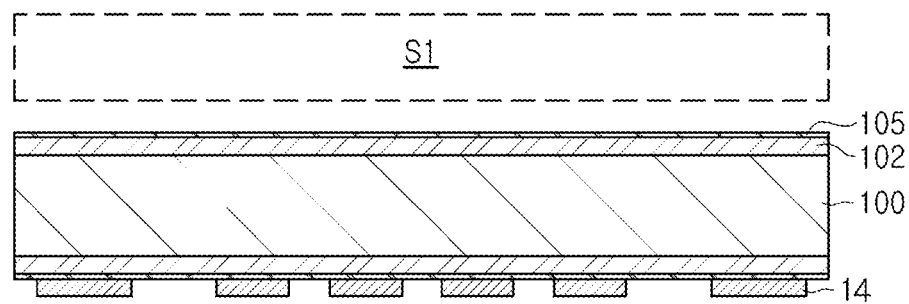
FIGS. 7a through 7d are cross-sectional views illustrating a process of manufacturing the printed circuit board before separation from a carrier in a method for manufacturing the printed circuit board of FIG. 3.

FIG. 7a is a cross-sectional view of a state in which a carrier 100 is provided and the first wiring pattern 14 is formed. The carrier refers to a structure capable of carrying a board, and the carrier 100 may include, for example, a rigid structure formed of silicon or a glass wafer or containing a metal. A bonding layer 102 and a metal foil 105 serving as a seed layer for forming the wiring pattern may be formed on the carrier 100. The metal foil 105 may be a conductive copper foil.

Although the process for the printed circuit board may be performed on both upper and lower sides of the carrier 100, only the process performed on one side of the carrier is illustrated for the sake of simplification of the drawing.

Figure 7B:
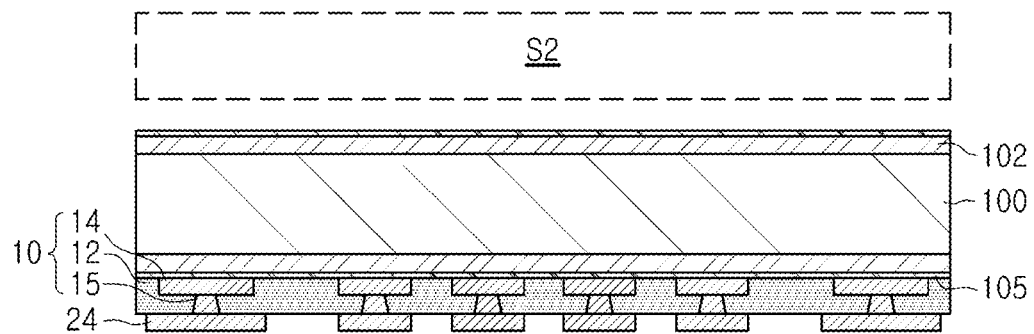
Figure 7C:
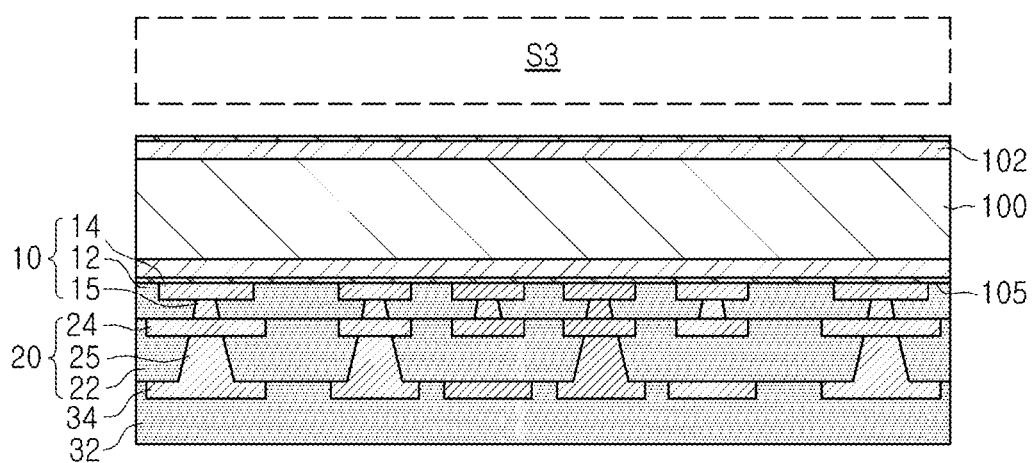

FIG. 7b is a cross-sectional view illustrating a process S2 of building up the outermost insulating layer 12, the first conductive via layer 15 in the outermost insulating layer 12, and the second wiring pattern 24 on the outermost insulating layer 12, so that the first conductive via layer 15 connects the first wiring pattern 14 and the second wiring pattern 24. Further, FIG. 7c is a cross-sectional view illustrating a process S3 of building up the second insulating layer 22, the second conductive via layer 25 in the second insulating layer 22, and the third wiring pattern 34 on the second insulating layer 22, so that the second conductive via layer 25 connects the second wiring pattern 24 and the third wiring pattern 34.

More insulating layers, wiring patterns, and conductive via layers may be built up as needed.

Figure 7D:
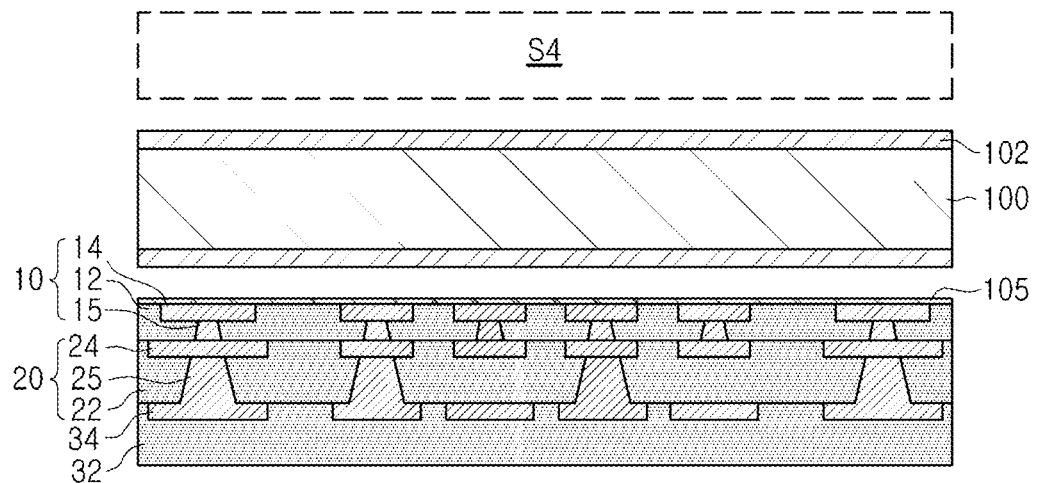

FIG. 7d illustrates a process S4 of separating the built-up substrate layer from the carrier. Here, the metal foil 105 attached to the carrier 100 may be separated together with the substrate layer.

Figure 8A:
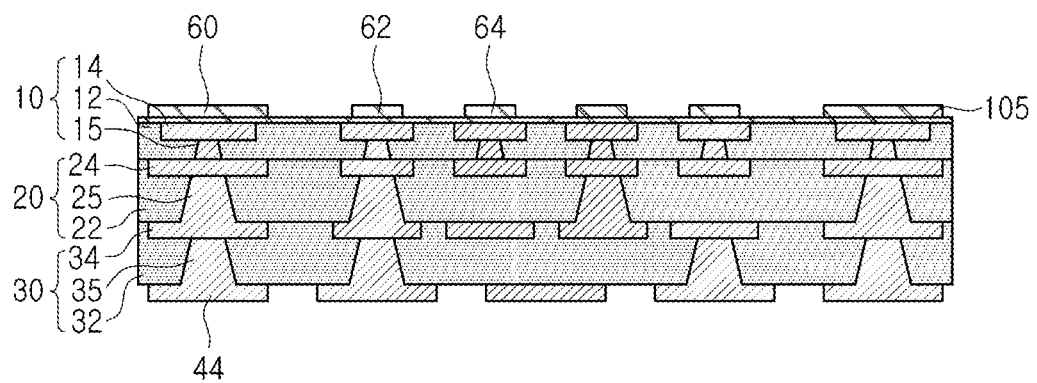
FIGS. 8a through 8c are cross-sectional views illustrating a process of manufacturing the printed circuit board after separation from the carrier in the method for manufacturing the printed circuit board of FIG. 3.
Figure 8B:
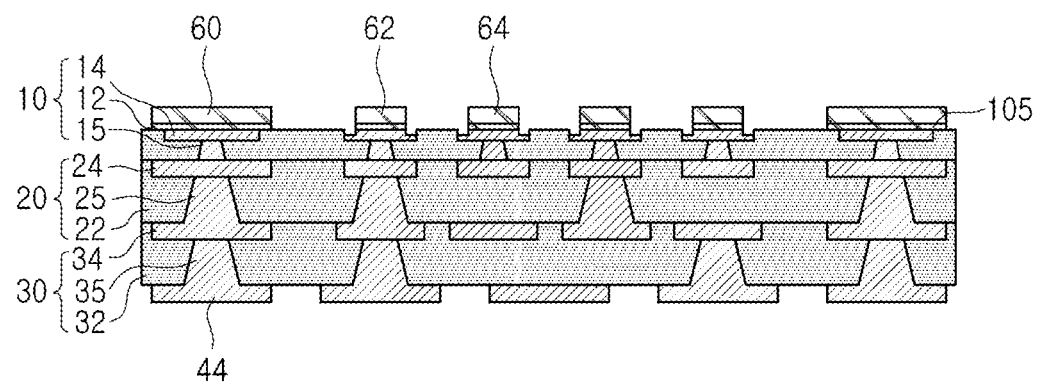
Figure 8C:
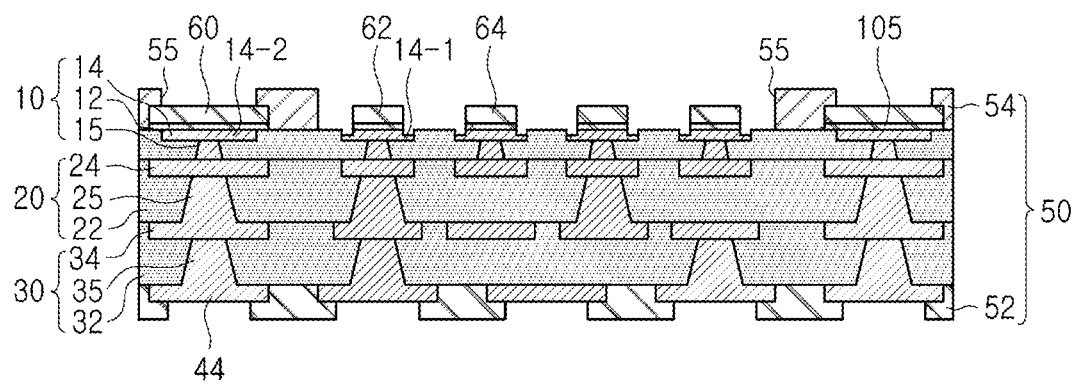

FIGS. 8a through 8c are cross-sectional views illustrating a process of manufacturing the printed circuit board after separation from the carrier in the method for manufacturing the printed circuit board of FIG. 3.

As illustrated in FIG. 8a, the external connection pad 60 and the bump pad 62 may be formed on the separated substrate layer by using the metal foil 105 as the seed layer, and the external connection pad 44 may be formed on a lower surface of the lowermost insulating layer 32 of the substrate layer.

FIG. 8b illustrates a process for removing the metal foil 105 by etching. Here, portions of the metal foil 105 that are covered by the external connection pad 60 and the bump pads 62 and 64 are maintained and are not removed, but portions of the metal foil 105 that are not covered by the external connection pad 60 and the bump pads 62 and 64 may be removed by etching. When the portions of the metal foil 105 that are not covered by the bump pads 62 and 64 are etched, in a case in which a component under the metal foil 105 is not the insulating layer 12, but the first upper wiring pattern 14-1, the first upper wiring pattern 14-1 may be partially etched together, such that the solder dam 12D is formed in the insulating layer 12.

The depth of the solder dam 12D preventing a short circuit caused by a solder bridge in the insulating layer 12 is determined by the above-described etching.

FIG. 8c illustrates a process of applying the solder resists 52 and 54 and forming the holes 55 to expose the external connection pads 60 and 44 and the bump pads 62 and 64 to the outside.

Electronic Component Package

Figure 9:
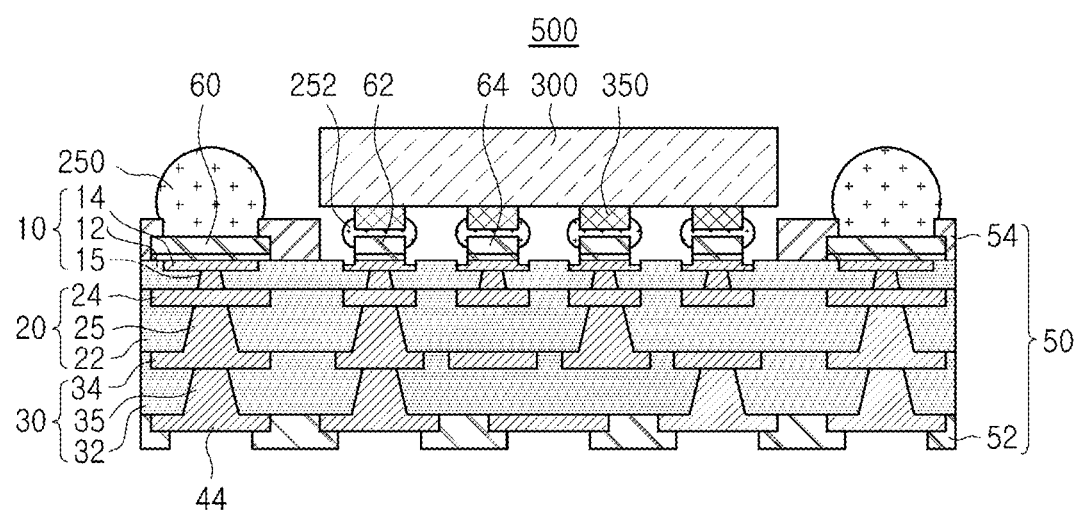
FIG. 9 is a schematic cross-sectional view of an electronic component package according to an exemplary embodiment in the present disclosure.

FIG. 9 is a schematic cross-sectional view of an electronic component package according to an exemplary embodiment in the present disclosure.

Referring to FIG. 9, an electronic component package 500 according to an exemplary embodiment in the present disclosure may include the above-described printed circuit board 1 and a semiconductor chip 300.

The printed circuit board 1 may include the external connection pad 60 and the bump pads 62 and 64 as described above. Semiconductor nodes 350 may be connected to the densely formed bump pads 62 and 64, respectively, by soldering 252. A solder ball 250 of the external connection pad 60 may be coupled to another external printed circuit board or a passive component.

In addition, the semiconductor chip 300 may be molded with an encapsulation layer and may thus be protected from an external environment.

As set forth above, according to the exemplary embodiment in the present disclosure, with the printed circuit board according to the present disclosure, problems such as a short circuit caused by a solder bridge and a warpage in a packaging process caused when the chip is mounted even with the bump pads densely arranged with a small pitch therebetween may be solved.

In the printed circuit board according to the present disclosure, for example, the external connection pad and the bump pad that have different lengths may be simultaneously formed, which may improve process efficiency.

With the printed circuit board according to the present disclosure, the soldering performance is improved even when the circuit board has a small size, such that the overall packaging performance may be improved.

While exemplary embodiments have been shown and described above, it will be apparent to those skilled in the art that modifications and variations could be made without departing from the scope of the present disclosure as defined by the appended claims.

What is claimed is:
1. A printed circuit board comprising:
   a substrate layer in which a plurality of insulating layers and a plurality of wiring patterns are repeatedly layered in a thickness direction, the substrate layer including a conductive via layer disposed in one of the plurality of insulating layers to connect wiring patterns, among the plurality of wiring patterns, disposed on upper and lower surfaces of the one of the plurality of insulating layers, respectively;
   an uppermost substrate layer including an outermost insulating layer disposed on an outermost surface of the substrate layer, and a first upper wiring pattern disposed in the outermost insulating layer;

a bump pad disposed on a portion of an upper surface of the first upper wiring pattern and having a length shorter than a length of the first upper wiring pattern; and a solder resist layer having a first hole exposing the bump pad, and having a height greater than that of the bump pad with respect to an upper surface of the outermost insulating layer, wherein in a cross section of the printed circuit board cut in the thickness direction, a side surface of the bump pad extends in the thickness direction, another portion of the upper surface of the first upper wiring pattern is lower than the upper surface of the outermost insulating layer, and the outermost insulating layer has a solder dam protruding so as to be higher than the another portion of the upper surface of the first upper wiring pattern.

2. The printed circuit board of claim 1, wherein an upper surface of the bump pad is higher than the upper surface of the outermost insulating layer.

3. The printed circuit board of claim 1, wherein a recess portion is provided between a side surface of the solder dam and a side surface of the bump pad.

4. The printed circuit board of claim 1, wherein the uppermost substrate layer includes a second upper wiring pattern disposed to be spaced apart from the first upper wiring pattern, an external connection pad is disposed on an upper surface of the second upper wiring pattern, and a length of the external connection pad is larger than a length of the second upper wiring pattern.

5. The printed circuit board of claim 4, wherein the solder resist layer covers a portion of the external connection pad and has a second hole exposing another portion of the external connection pad, and the height of the solder resist layer is greater than that of the external connection pad with respect to the upper surface of the outermost insulating layer.

6. The printed circuit board of claim 5, wherein the solder resist layer includes a photosensitive material or a thermosetting material.

7. A printed circuit board comprising:

a substrate layer in which a plurality of insulating layers and a plurality of wiring patterns are repeatedly layered in a thickness direction, the substrate layer including a conductive via layer disposed in one of the plurality of insulating layers to connect wiring patterns, among the plurality of wiring patterns, disposed on upper and lower surfaces of the one of the plurality of insulating layers, respectively;

an uppermost substrate layer including an outermost insulating layer disposed on an outermost surface of the substrate layer, and a first upper wiring pattern disposed in the outermost insulating layer;

a bump pad disposed on a portion of an upper surface of the first upper wiring pattern; and a solder resist layer having a hole exposing the bump pad, and having a height greater than the bump pad with respect to an upper surface of the outermost insulating layer, wherein another portion of the upper surface of the first upper wiring pattern is lower than the upper surface of the outermost insulating layer, the outermost insulating layer has a solder dam protruding so as to be higher than the another portion of the upper surface of the first upper wiring pattern, a recess portion is provided between a side surface of the solder dam and a side surface of the bump pad, in a cross section of the printed circuit board cut in the thickness direction, a side surface of the bump pad extends in the thickness direction, the uppermost substrate layer includes a second upper wiring pattern disposed to be spaced apart from the first upper wiring pattern, an external connection pad is disposed on an upper surface of the second upper wiring pattern, and a length of the external connection pad is larger than a length of the second upper wiring pattern.

8. The printed circuit board of claim 7, wherein an upper surface of the bump pad is higher than the upper surface of the outermost insulating layer.

9. The printed circuit board of claim 7, wherein the solder resist layer includes a photosensitive material or a thermosetting material.

10. An electronic component package comprising:

a printed circuit board including a substrate layer in which a plurality of insulating layers and a plurality of wiring patterns are repeatedly layered, the substrate layer including a conductive via layer disposed in one of the plurality of insulating layers to connect wiring patterns, among the plurality of wiring patterns, disposed on upper and lower surfaces of the one of the plurality of insulating layers, respectively, an uppermost substrate layer including an outermost insulating layer disposed on an outermost surface of the substrate layer, and a first upper wiring pattern disposed in the outermost insulating layer, and a bump pad disposed on a portion of an upper surface of the first upper wiring pattern and having a length shorter than a length of the first upper wiring pattern, and a solder resist layer having a hole exposing the bump pad and having a height greater than that of the bump pad with respect to an upper surface of the outermost insulating layer; and a semiconductor chip connected to the bump pad by a solder different from the bump pad, wherein an upper surface of the bump pad is higher than the upper surface of the outermost insulating layer, another portion of the upper surface of the first upper wiring pattern is lower than the upper surface of the outermost insulating layer, and the outermost insulating layer has a solder dam protruding so as to be higher than the another portion of the upper surface of the first upper wiring pattern.

11. The electronic component package of claim 10, wherein a recess portion is provided between a side surface of the solder dam and a side surface of the bump pad.

12. The electronic component package of claim 10, wherein the uppermost substrate layer includes a second upper wiring pattern disposed to be spaced apart from the first upper wiring pattern, an external connection pad is disposed on an upper surface of the second upper wiring pattern, and a length of the external connection pad is larger than a length of the second upper wiring pattern.

13. A printed circuit board comprising:

a substrate layer in which a plurality of insulating layers and a plurality of wiring patterns are repeatedly layered in a thickness direction, the substrate layer including a conductive via layer disposed in one of the plurality of insulating layers to connect wiring patterns, among the plurality of wiring patterns, disposed on upper and lower surfaces of the one of the plurality of insulating layers, respectively;

an uppermost substrate layer including an outermost insulating layer disposed on an outermost surface of the substrate layer, and a first upper wiring pattern disposed in the outermost insulating layer;

a bump pad disposed on the first upper wiring pattern; and a solder resist layer having a hole exposing the bump pad, and having a height greater than that of the bump pad with respect to an upper surface of the outermost insulating layer, wherein the outermost insulating layer includes a dam protruding with respect to a recess portion disposed between the outermost insulating layer and the bump pad, in a cross section of the printed circuit board cut in the thickness direction, a side surface of the bump pad extends in the thickness direction, the uppermost substrate layer includes a second upper wiring pattern spaced apart from the first upper wiring pattern, and an external connection pad is disposed on an upper surface of the second upper wiring pattern.

14. The printed circuit board of claim 13, wherein an upper surface of the bump pad is higher than the upper surface of the outermost insulating layer.

15. The printed circuit board of claim 13, wherein the bump pad has a length shorter than a length of the first upper wiring pattern, and the external connection pad has a length larger than a length of the second upper wiring pattern.

16. The printed circuit board of claim 13, wherein the solder resist layer is spaced apart from the bump pad, covers a portion of the external connection pad, and has another hole exposing another portion of the external connection pad, and the height of the solder resist layer is greater than that of the external connection pad with respect to the upper surface of the outermost insulating layer.

17. The printed circuit board of claim 13, wherein the recess portion surrounds the bump pad.

18. The printed circuit board of claim 13, wherein the recess portion is provided in the first upper wiring pattern.

* * * * *